STABLE SWEEP OSCILLATOR

INVENTORS
WILLIAM A. POWER
FRANK E. POST
BY
Maleson + Ratner
ATTORNEYS.

INVENTORS.
WILLIAM A. POWER
FRANK E. POST
BY
Maleson + Ratner
ATTORNEYS.

INVENTORS
WILLIAM A. POWER
FRANK E. POST
BY
Maleson + Ratner
ATTORNEYS.

INVENTORS.
WILLIAM A. POWER
FRANK E. POST

BY Maleson & Ratner

ATTORNEYS.

STABLE SWEEP OSCILLATOR

Filed Jan. 3, 1967

INVENTORS.
WILLIAM A. POWER
FRANK E. POST
BY
Maleson + Ratner
ATTORNEYS.

INVENTORS.
WILLIAM A. POWER
FRANK E. POST
BY
Maleson & Ratner
ATTORNEYS.

United States Patent Office 3,422,372
Patented Jan. 14, 1969

3,422,372
STABLE SWEEP OSCILLATOR

Frank E. Post, Warminster, and William A. Power, Willow Grove, Pa., assignors to Weston Instruments, Inc., Newark, N.J., a corporation of Delaware Filed Jan. 3, 1967, Ser. No. 607,045
U.S. Cl. 331—178 12 Claims
Int. Cl. H03b 3/00; H03k 3/26; H03k 1/10

ABSTRACT OF THE DISCLOSURE

An oscillator for producing a swept composite sine wave. A series of pulses is first generated in which the pulse repetition frequency may be varied over a predetermined band of pulse frequencies. The rate of variation in the pulse frequency is determined by a generated function which is used to modulate pulses applied as an input to an integrator. The series of pulses is applied to a transfer function generator to produce the swept composite waveform.

Figure 1:
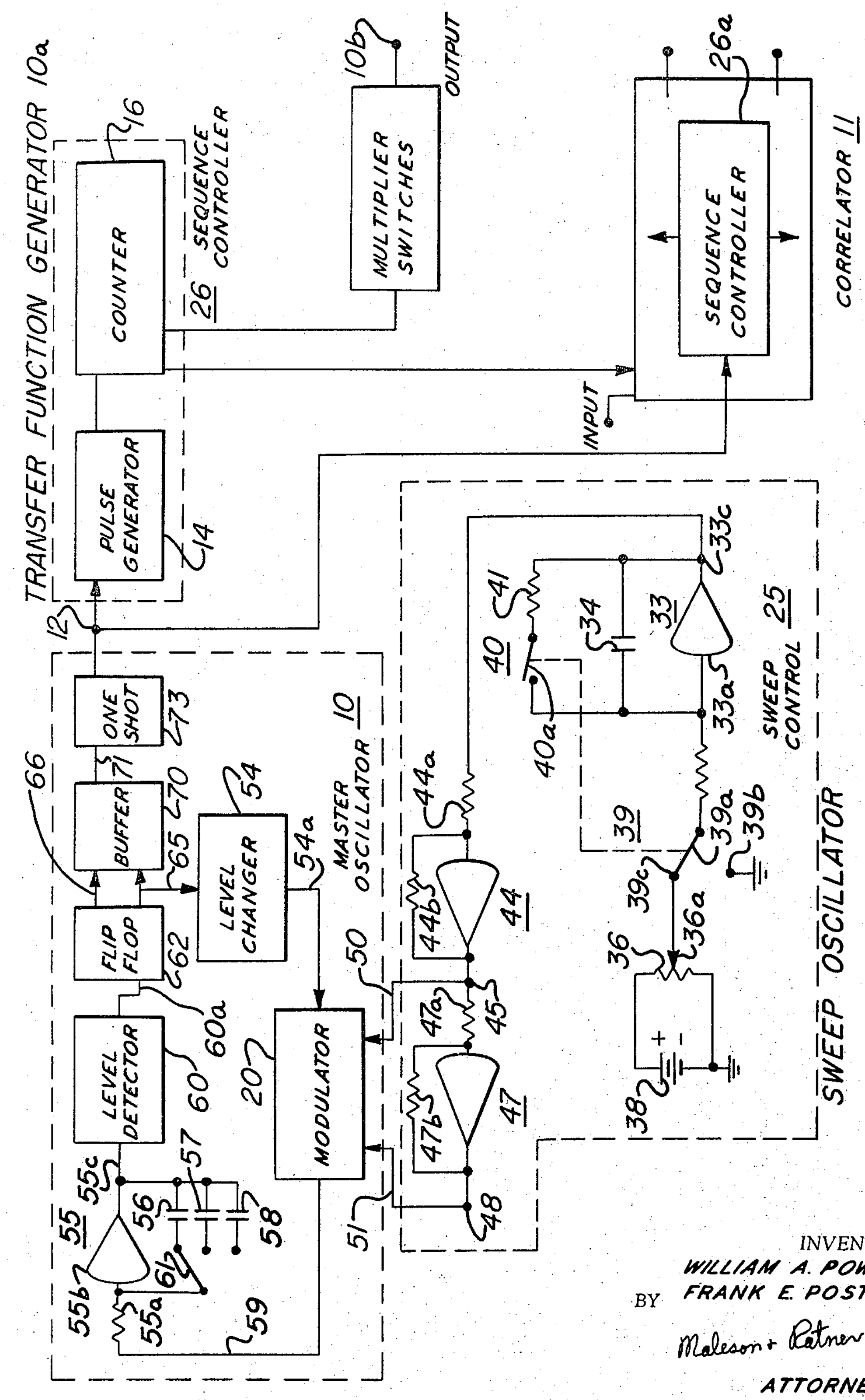

This invention relates to the field of art of stable oscillators producing a series of pulses in which the pulse repetition frequency may be swept through a band of pulse frequencies to produce a swept composite sine wave.

Stable sweep oscillators provide a series of pulses in which the pulse repetition frequency varies at a predetermined rate to sweep through a desired band of pulse frequencies. Such a sweep oscillator may be used as the master oscillator in a transfer function analyzer as described in patent application Ser. No. 581,275 for Transfer Function Analyzer, filed Sept. 22, 1966, by Frank E. Post and assigned to the same assignee as the present invention. In this analyzer, the master oscillator provides a series of pulses to control the timing of both a transfer function generator and a correlator. Under the control of the master oscillator, the function generator produces a digital sinusoidal waveform which is used as a stimulating signal for a system under test. The sinusoidal waveform is produced by generating a plurality of separate signals of rectangular waveform, of triangular waveform and summing these signals to provide an oscillatory signal of composite waveform. The output of a system under test is measured by the correlator which is controlled by the master oscillator and the function generator for providing a measurement of the transfer function of the system under test. Since the master oscillator may sweep a band of pulse frequencies, the stimulating signal is swept over a band of sinusoidal frequencies. In this manner, the system under test is analyzed over a band of frequencies.

In accordance with the present invention, a sweep oscillator includes a function generator for producing voltage ramps upon application of modulated signals from a modulator. A sweep control system provides at least one signal varying in accordance with a predetermined function which is applied to modulate the signals produced by the modulator. The voltage ramps are used to switch a bistable device and to generate the series of output pulses with the pulse repetition frequency varying in accordance with the predetermined function.

More particularly, in carrying out the present invention in one form thereof, a transfer function generator for producing a swept composite sinusoidal waveform includes a sweep oscillator comprising an integrator for producing linear first voltage ramps. The ramps are applied to a bistable device for switching the state thereof when a positive slope ramp reaches a predetermined positive potential and when a negative slope ramp reaches a predetermined negative potential. The output of the bistable device is applied to a pulse generator which produces an oscillator output pulse each time the bistable device changes stable state. The sweep control system produces second voltage ramps, one of positive slope and one of negative slope, with each of these slopes being of substantially smaller value than the first ramps. A modulator is connected to the output of the bistable device and produces modulated pulses for application to an input of the integrator. The modulated pulses have a time duration substantially equal to that of each of the stable states of the bistable means with each of the pulses being modulated in amplitude by the second ramps. In this manner, the slopes of the first ramps are in sequence varied in value so that the bistable means switches state at a linearly varying rate and thereby to vary the pulse repetition frequency over a band of frequencies at a linear rate.

Figure 2A:
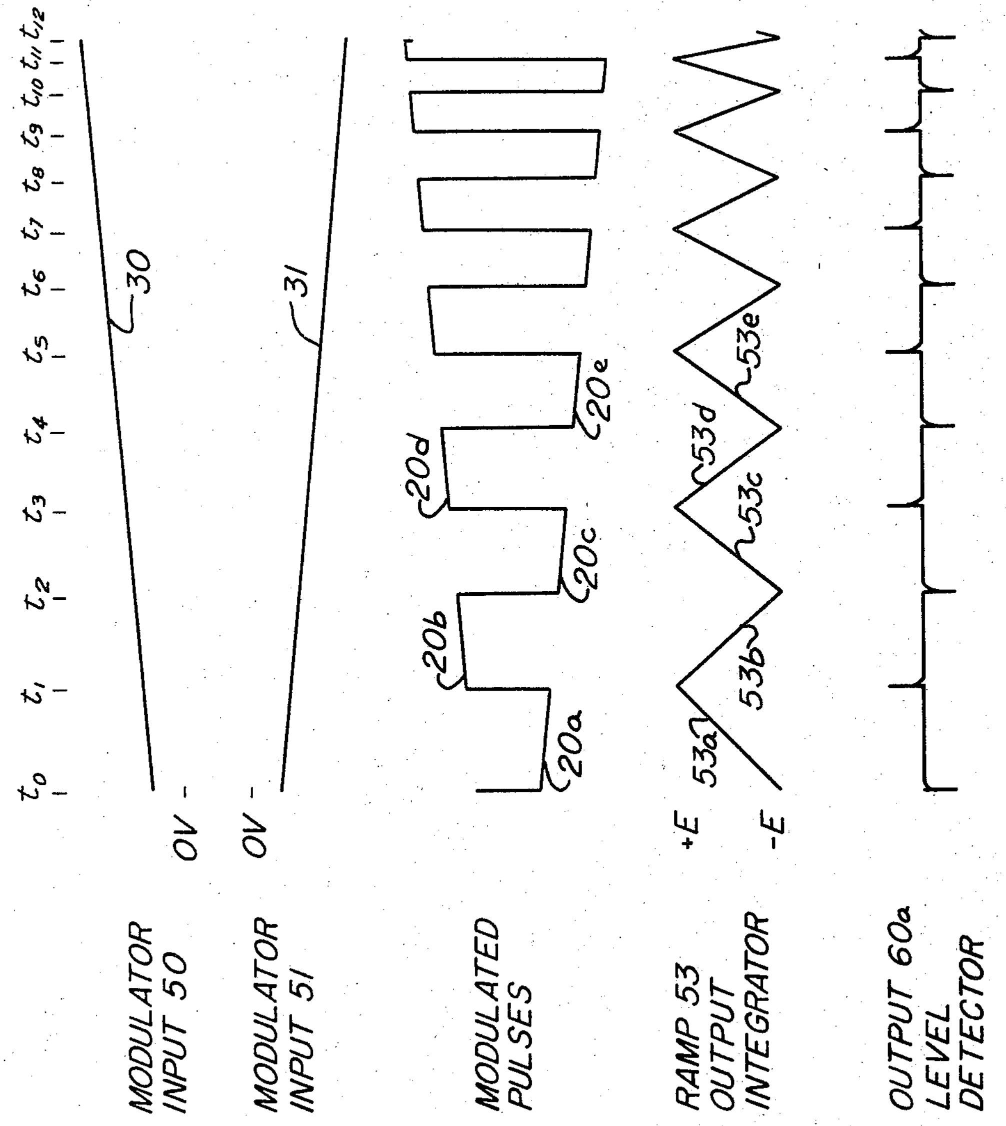
Figure 2B:
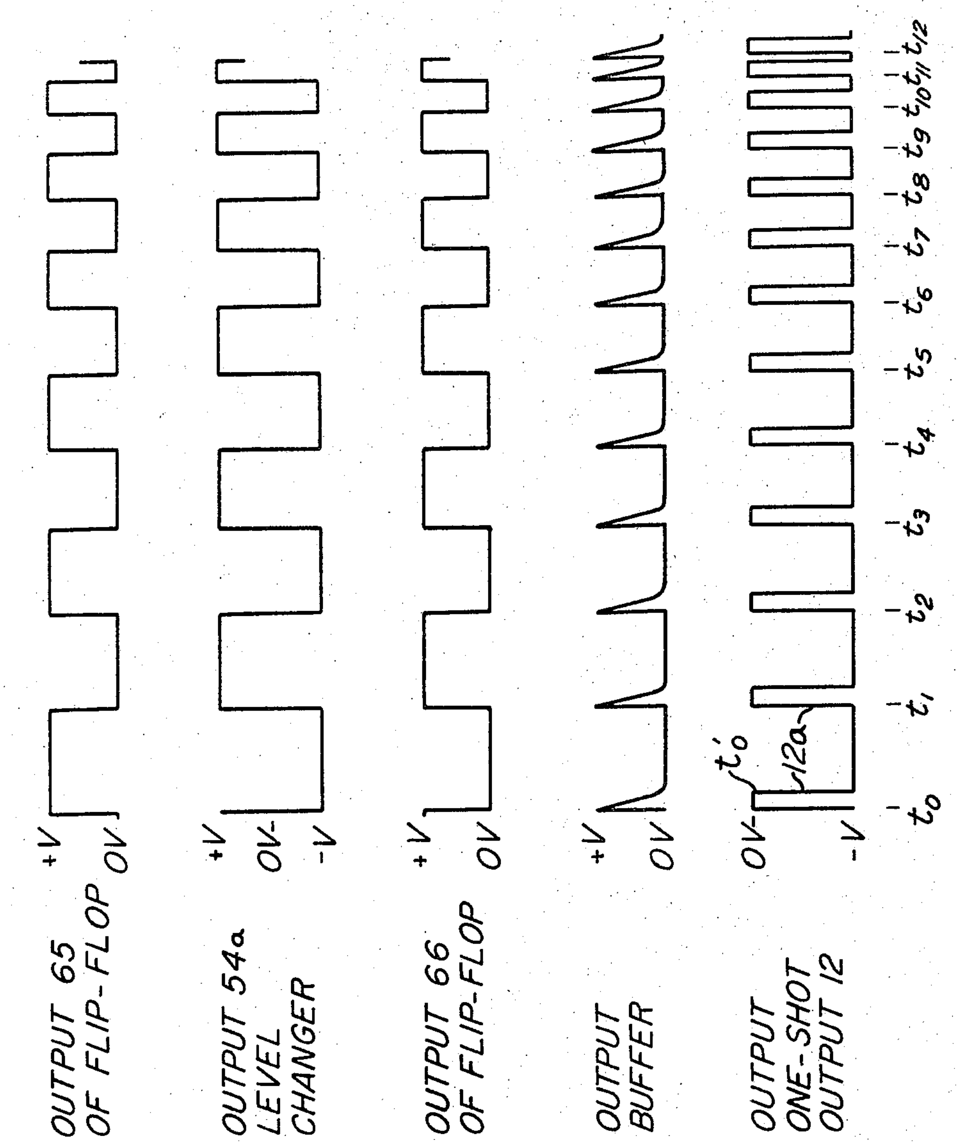
Figure 3A:
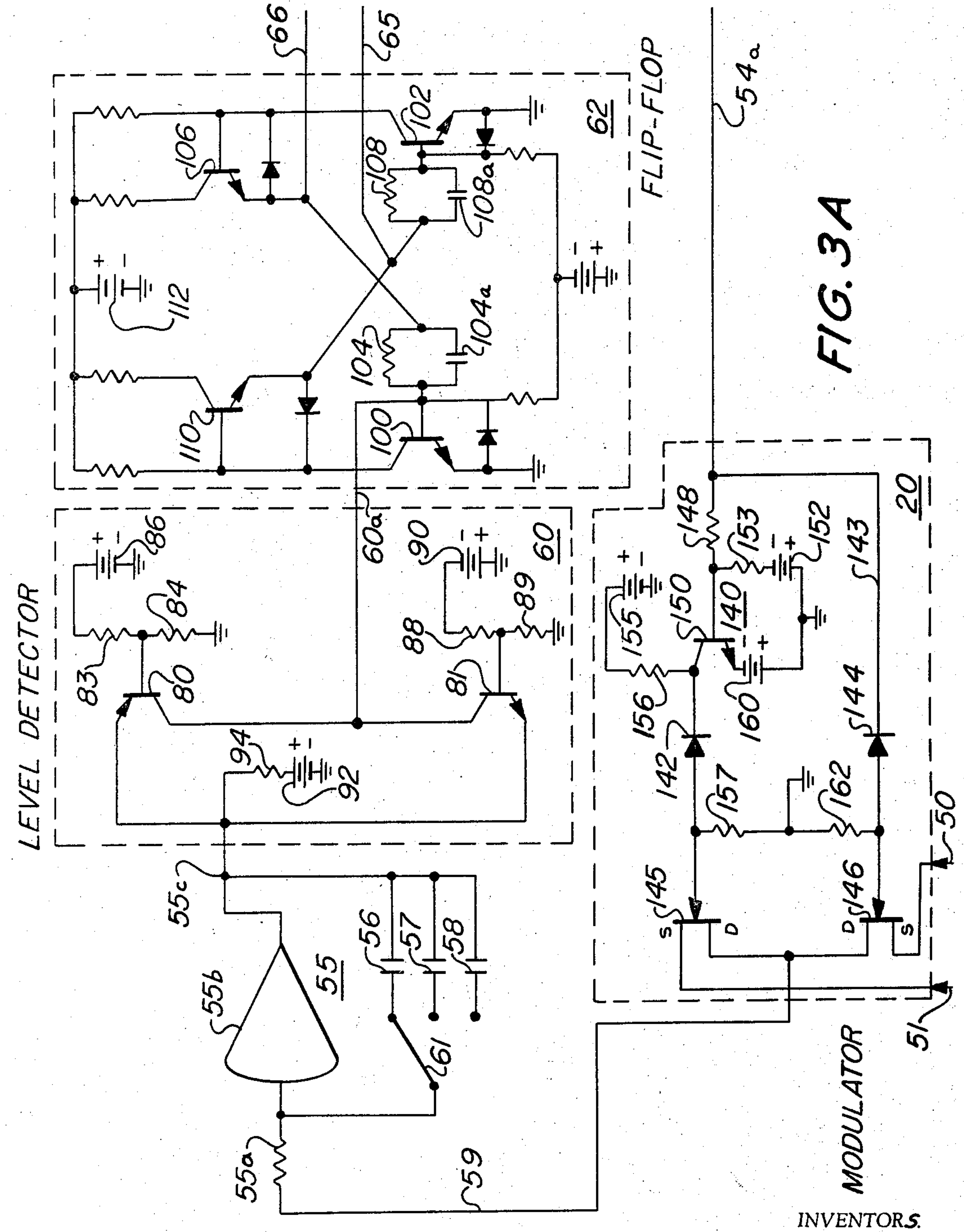
Figure 3B:
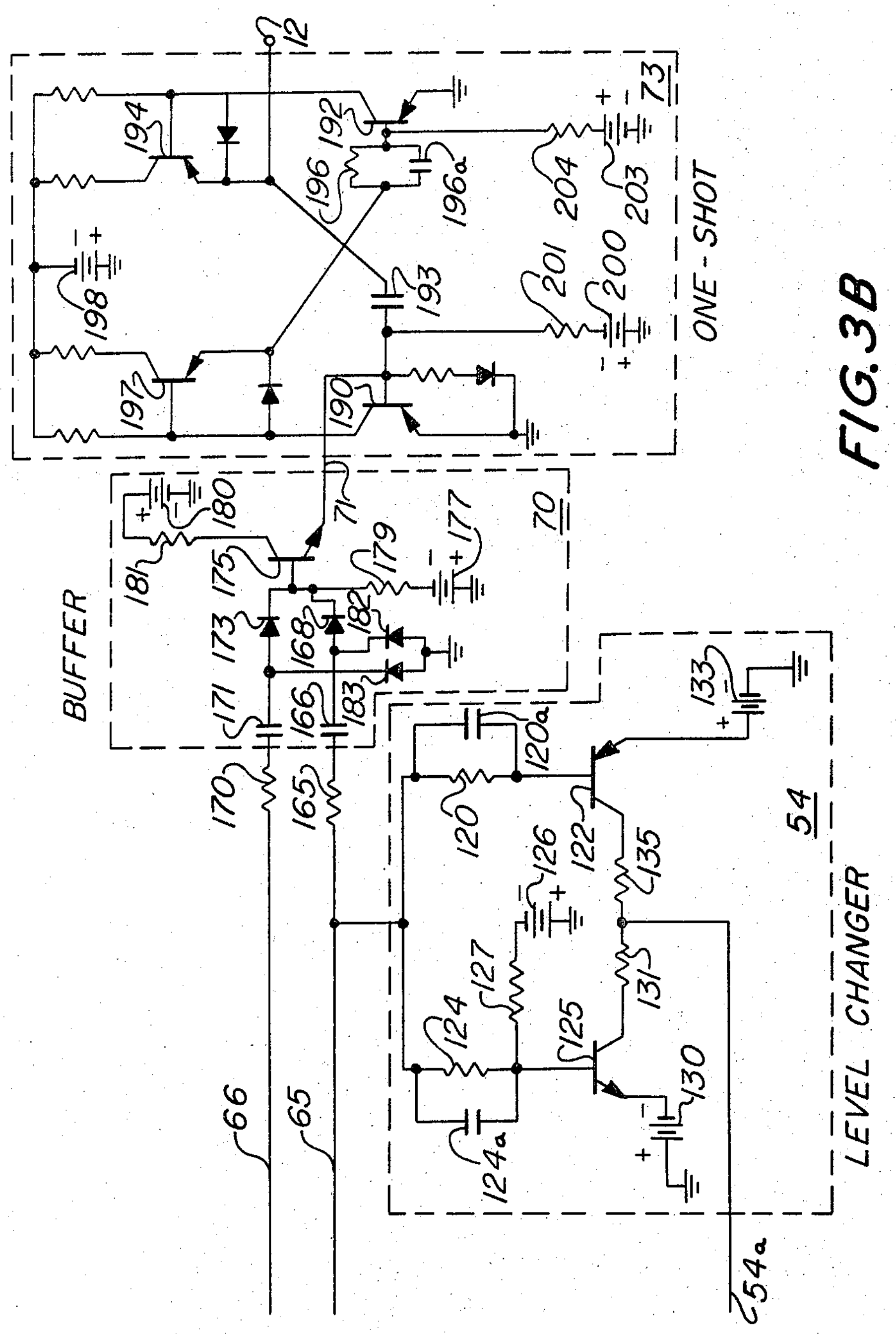
Figure 4:
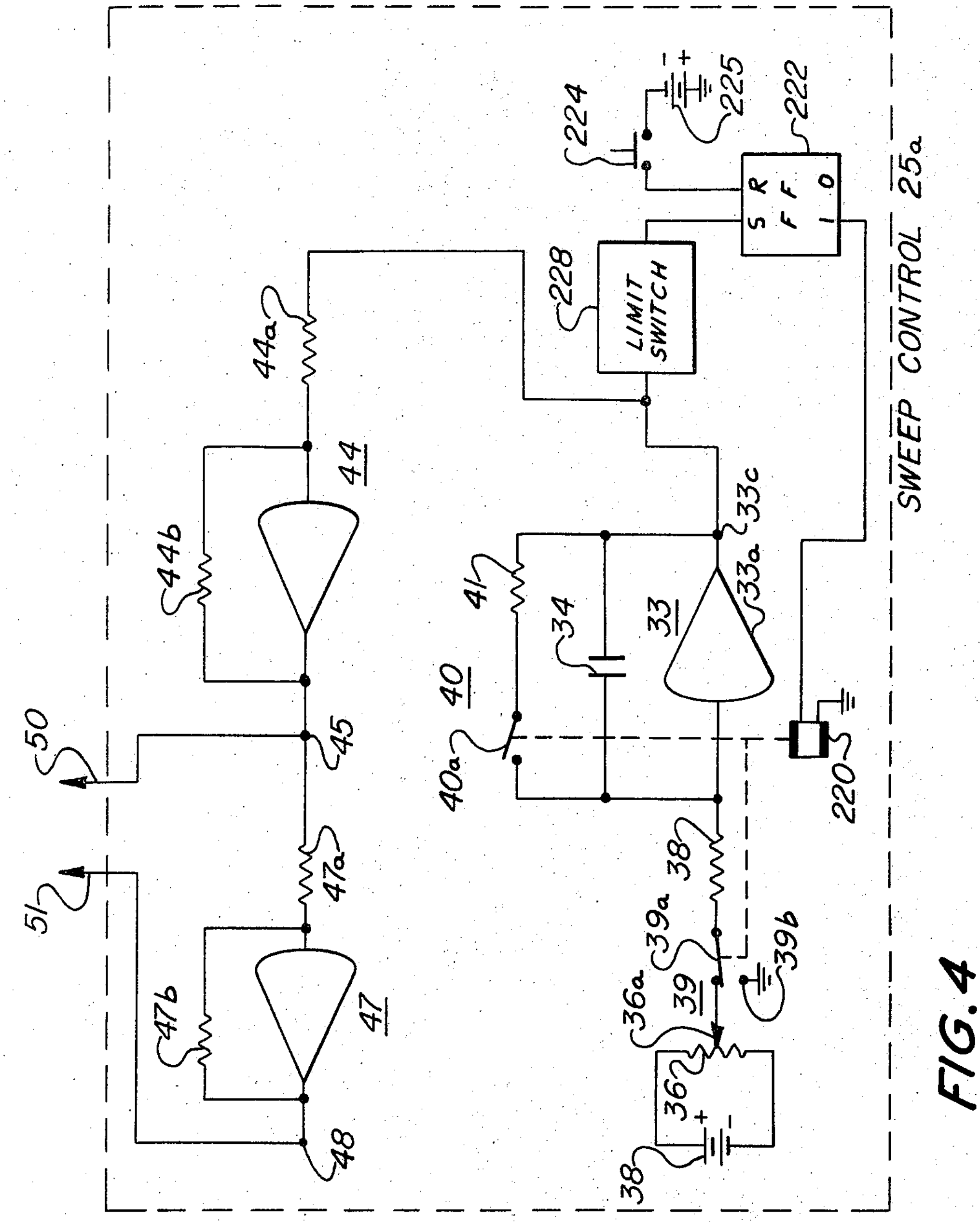

For further objects and advantages of the invention and for a typical embodiment thereof, reference is to be had to the following description taken in conjunction with the accompanying drawings in which:

FIG. 1 is a block diagram including circuit elements of a transfer function analyzer having a stable sweep oscillator in accordance with the invention;

FIGS. 2A and 2B taken together illustrate waveforms taken at various points in the sweep oscillator of FIG. 1;

FIGS. 3A and 3B taken together schematically illustrate in detail a portion of the sweep oscillator of FIG. 1; and FIG. 4 illustrates a circuit diagram of modification of the sweep control for the sweep oscillator of FIG. 1.

Referring now to FIG. 1, there is shown a master oscillator 10 for a transfer function analyzer described in the above-cited patent application Ser. 581,275 and in Instruction Manual, Transfer Function Analyzer Model Serial DA400, Weston-Boonshaft and Fuchs, Hatboro, Pa. A transfer function analyzer comprises a transfer function generator 10*a* and a correlator 11. There has only been illustrated those portions of generator 10*a* and correlator 11 which show interconnections with master oscillator 10.

Oscillator 10 provides a series of pulses at an output 12 connected to (1) an input of sequence controller 26 of function generator 10*a* and (2) an input of sequence controller 26*a* of correlator 11. The input of controller 26 is applied to a pulse generator 14 which provides input signals to a counter 16 having outputs connected to correlator 11 and to multiplier switches 17.

Multiplier switches 17 produce a digital or composite waveform approximating a sine wave at output 10*b* of generator 10*a*. The first positive going half cycle of the sine wave may comprise eight parts 11–14 of rectangular waveform. The rectangular waveforms are of progressively shorter duration and of progressively smaller amplitudes with the parts being symmetrical and added one on the other. Further, the first quarter cycle has added thereto nine parts of right angled triangular waveform of equal durations but progressively smaller amplitudes. The rectangular and triangular waveforms are summed to provide a composite waveform. The second quarter cycle also has five parts identical in amplitude but with the slopes of the hypotenuses reversed at 90°. A second half cycle is identical with the first half cycle except of course that it is negative going. Both positive and negative half cycles have the timing accurately controlled by sequence controller 26. The sine wave output from terminal 10*b* may be applied as a stimulating signal to a system under test, as for example, a servo-system. In such a testing procedure, an output of the system under test may be applied as an input signal for correlation by correlator 11.

With terminal 12 of oscillator 10 connected to both generator 10*a* and correlator 11, it will be understood that sequence controller 26*a* of correlator 11 and sequence controller 26 of generator 10*a* are both accurately controlled in synchronism.

Oscillator 10 without the use of a modulator 20, provides a series of pulses having constant pulse width at a selected pulse repetition frequency. Accordingly, transfer function generator 10*a* provides a sine wave of predetermined frequency. A different oscillator pulse frequency may be selected to provide a corresponding change in the frequency of the sine wave of generator 10*a*. In order to provide a linear sweep of composite sinusoidal frequencies by generator 10*a* which may be correlated by correlator 11, oscillator 10 is effective to sweep through a band of frequencies as shown in FIG. 2.

In order to sweep a band of pulse frequencies to provide a linearly changing pulse rate, there is provided a sweep control system 25 and a modulator 20 with the resultant system comprising a sweep oscillator. Sweep control 25 produces a slowly rising linear voltage ramp 30 of positive slope and a slowly falling linear voltage ramp 31 of negative slope both shown in FIG. 2. Voltage ramps 30 and 31 are defined by substantially straight lines and extend over a time duration substantially much greater than the time duration of the rectangular pulses 12*a* produced by oscillator 10 at output terminal 12. For example, ramps 30 and 31 may extend in time duration from one hundred to three thousand times the time duration of pulses 12*a*. For purposes of illustration in FIG. 2, the pulse frequency with respect to the slope of ramps 30 and 31 is shown as being smaller in value than in practise.

In order to produce voltage ramps 30 and 31, sweep control system 25 includes an integrator 33 comprising an operational amplifier 33*a* and an integrating capacitor 34 of substantially large capacitive value. The input to integrator 33 is taken from a sweep rate adjust potentiometer 36 having one of its fixed terminals connected to the positive side of a battery 38 and its other fixed terminal connected to the negative side of that battery and to ground. Movable terminal 36*a* of sweep rate potentiometer 36 is connected by way of a fixed contact 39*c*, movable contact 39*a* of switch 39 and an input resistor 38 to the summing junction 33*b* of integrator amplifier 33*a*. Between summing junction 33*b* output and an output 33*c* of amplifier 33*a* there is connected in parallel, integrator capacitor 34 and a starting circuit comprising a switch 40 in series circuit with a resistor 41. Movable contact 40*a* of switch 40 is actuated in synchronism with movable contact 39*a*. Initially both contacts 40*a* and 39*a* are actuated to their lower position with contact 39*a* engaging a grounded fixed contact 39*b* and switch 40 in its closed circuit position. In this manner, integrating capacitor 34 is shunted by resistor 41 and ground potential is applied to the input of integrator 33 producing a grounded output.

In order to initiate a ramp voltage, switches 39 and 40 are actuated to their illustrated upper position. Thus, contact 39*a* engages fixed contact 39*c* thereby to apply a selected positive potential sweep rate potential to integrator 33 and at the same time shorting switch 40 is opened. With a positive input potential applied to integrator 33, there is produced at output 33*c* a linear voltage slowly falling ramp of negative slope. This negative slope ramp is applied to a first operational amplifier 44 having an input resistor 44*a* and a feedback resistor 44*b*. Amplifier 44 inverts the applied negative slope ramps and produces at an output 45, a positive slope ramp 30 shown in FIG. 2. The positive slope ramp 30 is inverted by an operational amplifier 47 having an input resistor 47*a* connected to terminal 45 and a feedback resistor 47*b*. The resultant inverted ramp is a negative slope ramp 31 produced at output terminal 48 as illustrated in FIG. 2.

Amplifiers 33*a*, 44 and 47 may be of the D-C type as described for example in Korn and Korn, Electronic Analog and Hybrid Computers, McGraw-Hill Book Co., 1964, page 122 et seq. Amplifiers 44 and 47 may have input and feedback resistors chosen so that each amplifier provides a total gain of one, for example. Thus, the slopes of ramps 30 and 31 are equal in magnitude but opposite in sign.

Voltage ramps 30 and 31 are applied to modulator 20 by way of input conductors 50 and 51 respectively. The remaining input to modulator 20 is a series of rectangular pulses, negative going and positive going with respect to ground, of constant amplitude from a level changer circuit 54, the operation of which will later be described in detail. The pulses from changer circuit 54 are modulated by modulator 20 with the amplitude of the positive going pulses being modulated by ramp 30 while the negative going pulses are modulated by voltage ramp 31 to produce a resultant waveform as shown in FIG. 2. The modulated signals are applied by way of input conductor 59 to an integrator 55 having an input resistor 55*a*, an operational amplifier 55*b* and parallel connected integrator capacitors 56–58.

A selector switch 60 has its movable contact connected to the summing junction of amplifier 55 and selectively engages one of the differing valued integrating capacitors 56–58 to be effective as the integrating capacitor for integrator 55. Thus, the rate of integration is a function of the selected capacitor which determines the limits of the band of pulse frequencies that may be swept. For example, capacitors 56–58 may be selected to have values in multiples of 10 so that if capacitor 58 is selected, a frequency band of 1–10 c.p.s. is swept; if capacitor 57 is selected, a band of 10–100 c.p.s. is swept and if capacitor 56 is selected, a band of 100–1,000 c.p.s. is swept.

Integrator 55 integrates a negative going input signal to generate a function of a linear voltage ramp at terminal 55*c* of positive slope and a positive going input signal to produce a linear voltage ramp of negative slope. These slopes are substantially more steep than the slopes of modulating ramps 30 and 31. The resultant voltage ramps at output terminal 55*c* of integrator 55 are applied to a level detector 60 which produces a negative going spike signal when the positive slope ramp reaches a predetermined positive potential. The predetermined positive and negative potentials at which detector 60 produces a spike are selected to be of equal magnitude.

The spike output of detector 60 is applied to switch a flip-flop 62 having one of its outputs 65 applied as an input to level changer circuit 54. Output 65 is the output terminal of flip-flop 62 which provides rectangular pulses having the same polarity direction as the voltage ramps at integrator output 55*c*. Specifically, between times $t_0$–$t_1$ the ramp is of positive slope or is positive going and output 65 produces a positive going signal similarly between times $t_1$–$t_2$ both the ramp and output 65 are negative going. Changer circuit 54 inverts the flip-flop output 65 and changes the pulse level to vary between a positive and a negative potential with respect to ground. The resultant signal is applied as an input to modulator 20. It will be understood that the integrator output signal is required to be inverted an odd number of times before being fed back to the input of integrator 55.

In operation, between times $t_0$ and $t_1$ the output of modulator 20 is a negative going modulated pulse 20*a* of amplitude equal to the magnitude of voltage ramp 31 between those times. In this manner, the negative going modulated pulse from modulater 20 increases in magnitude as ramp 31. The negative going modulated pulse 20*a* is applied to integrator 55 which generates a linear voltage ramp 54*a* of positive slope which continues until it reaches a magnitude of +E volts at time $t_1$. At that time, level detector 60 produces a positive going pulse thereby to switch flip-flop 62 from a second of its stable states to a first of its stable states. Accordingly, a negative going pulse is produced at output 65 which is effective to produce a positive going pulse from changer circuit 54, which is applied by way of output 54*a* to modulator 20. As a result, modulator 20 produces a positive going modulated pulse at time $t_1$ equal in magnitude to modulating ramp 30 at time $t_1$.

In manner similar to that described above, the positive going modulated pulse 20*b* from modulator 20 is integrated by integrator 55 to produce a linear voltage ramp 53*b* of negative slope. The ramp continues from time $t_1$ until a value −E volts is reached at time $t_2$. At that time, detector 60 produces a negative spike which switches flip-flop 62 from its first to its second stable state thereby to produce a negative going pulse at output 65 and a positive going pulse at output 54*a*.

It will be understood that the linear voltage ramp 53*b* of negative slope between times $t_1$–$t_2$ is shorter in time duration than the positive slope ramp 53*a* between times $t_0$–$t_1$. This is for the reason that the absolute voltage value of the positive going modulated pulse 20*b* between times $t_1$–$t_2$, is greater than the absolute value of the negative going modulated pulse 20*a* between times $t_0$–$t_1$. Thus, between times $t_1$–$t_2$, integrator 55 integrates at a faster rate as a result of the greater valued voltage input and reaches the value +E more quickly than between times $t_0$–$t_1$. Accordingly, between times $t_1$–$t_2$ as compared with times $t_0$–$t_1$, the integrator output ramp 53*b* has a greater magnitude slope as a result of the faster rate of integration. It will now be clear that ramp 53*b* between times $t_1$–$t_2$ reaches the predetermined detector voltage in less time than ramp 53*a* and thus, the time duration $t_1$–$t_2$ is less than the time duration $t_0$–$t_1$.

Similarly, between times $t_2$–$t_3$, a negative going modulated pulse 20*c* is produced by modulator 20 equal in magnitude to ramp 31 between those times. The voltage value of pulse 20*c* is greater in absolute magnitude than modulated pulse 20*b* between times $t_1$–$t_2$. Accordingly, the resultant positive slope ramp 53*b* produced by integrator 55 between times $t_2$–$t_3$ has a greater magnitude slope than the previous negative slope ramp 53*b* between times $t_1$–$t_2$. Thus, the time duration for positive slope ramp 53*c* to reach the predetermined detector voltage is less than that of ramp 53*b*.

Thus, it will now be understood that as each succeeding modulated pulse produced by modulator 20 increases in absolute amplitude, the rate of integration of integrator 55 increases correspondingly. With the rate of integration being increased, the slope of the resultant ramp increases in absolute magnitude so that the predetermined detector voltage is reached in a decreasing duration of time to produce the waveform shown in FIG. 2. In other words, the time duration of each of the ramps 53 decreases in turn as the absolute value of each of the modulating ramps 30 and 31 increases. Since ramps 30 and 31 change linearly with time, all of the foregoing changes take place at a linear rate.

With voltage ramps 53 increasing in slope and decreasing in time duration, it will be understood that outputs 65 and 66 of flip-flop 62 produce pulses which correspondingly decrease linearly in time duration. Outputs 65 and 66 are applied to a buffer 70 which produces a positive going pulse in the form of a spike at the time either of its input signals changes in a positive going direction. Thus, a positive going spike pulse is provided at the time of each signal reversal of output 65 and 66; as for example, at each of times $t_0$, $t_1$, $t_2$, $t_3$, etc. The spike signals are applied by way of an output 71 to an input of a one-shot or monostable multivibrator 73 which provides, upon application of each positive spike, a positive going rectangular pulse 12*a* of substantially short time duration, as for example, .6 microsecond. The output of one-shot 73 is connected to oscillator output 12 to provide the series of output pulses for master oscillator 10. In this manner, buffer 71 and one-shot 73 operate as pulse generator to produce rectangular pulses.

Since the output pulses at flip-flop outputs 65 and 66 successively decrease in time duration at a linear rate, it will be understood that the time duration between positive spikes from buffer 70 correspondingly decrease in time duration. Thus, one-shot 73 generates rectangular pulses 12*a* with the time duration between pulses in turn decreasing in value at a linear rate. This decrease in time duration between pulses is at a linear rate as a result of the linear slope of ramps 30 and 31 and the linear modulation of the modulated pulses from modulator 20. Accordingly, the pulse repetition frequency of pulses 12*a* increases at a highly stable linear rate with the pulse frequency changing from a rate having its lowest value adjacent time $t_0$ and its highest value adjacent time $t_{12}$, thereby to sweep through a band of frequencies between these two values.

In this way, a substantially high valued maximum pulse frequency is achieved. It will be understood that in accordance with the invention, the rate of sweeping between two limits of pulse frequencies may be increased by increasing the slope of ramps 30 and 31, which may be accomplished by changing the setting of potentiometer 36. On the other hand, the sweep rate may be decreased by decreasing the slope of ramps 30 and 31. When ramps 30 and 31 are adjusted to have a zero slope so that zero modulation takes place, the pulse rate of oscillator 10 remains constant at a value determined solely by the selected integrator capacitor 56–58.

Ramps 30 and 31 may be reversed in slope so that ramp 30 has a negative slope and ramp 31 has a positive slope. Therefore, the modulated pulses produced by modulator 20 successively decrease in amplitude and the slope of the ramps produced at output 55*c* correspondingly decrease in magnitude. Thus, pulses 12*a* produced at output 12 decrease in pulse rate from a maximum at time $t_0$ to a minimum at time $t_{12}$.

Referring now to FIG. 3, there is shown the detailed circuitry of master oscillator 10 including modulator 20. As previously described, output 55*c* of integrator 55 is connected to the input of level detector 60 which comprises a pair of switching transistors 80 and 81 of the PNP and NPN type respectively. Output 55*c* is connected to the emitters of transistors 80 and 81 with the collectors thereof being connected together and to output 60*a* of detector 60. Biasing supplies are connected to the bases of transistors 80 and 81 with the base of transistor 80 being connected to a common junction of voltage divider resistors 83 and 84. The other side of resistor 83 is connected to the positive side of a battery 86 and the other side of resistor 84 is connected to ground. Similarly, the base of transistor 81 is connected to a common junction of resistors 88 and 89 with the other side of resistor 88 being connected to the negative side of a battery 90 and the other side of resistor 89 is connected to ground. Biasing batteries 86, 90 and 92 and resistors 83, 84, 88, 89 and 94 are selected of value so that transistors 80 and 81 conduct at a desired potential of input ramps 53.

Specifically, as previously described, when positive slope ramps 53*a*, for example, reaches a predetermined positive potential, transistor 80 is turned on and the positive potential of battery 86 may be traced by way of resistor 83, conductive transistor 80, output 60*a* to the base of a switching transistor 100 of flip-flop 62. In this manner, transistor 100 turned on and the flip-flop is switched from its second stable state to its first stable state. Similarly, when negative slope ramp 53*b*, for example, reaches a predetermined negative potential, the bias on transistor 81 is selected so that it is turned on. At that time, $t_2$, the negative potential of battery 90 may be traced by way of resistor 88, conductive transistor 81, output 60*a* to transistor 100 thereby to turn off that transistor and to switch flip-flop 62 from its first to its second stable state.

Flip-flop 62 is a bistable circuit having a pair of cross connected switching transistors 100 and 102, both of the NPN type. A first of the cross connections may be traced from the base of transistor 100 through a parallel combination of resistor 104, capacitor 104*a* and then by way of the emitter-base junction of a transistor 106 to the collector of transistor 102. Similarly the second of the cross connections may be traced from the base of transistor 102 through a parallel combination of a resistor 108 and a capacitor 108*a* and then by way of the emitter-base junction of a transistor 110 to the collector of transistor 100. Transistors 106 and 110 are of the NPN type and are each connected as an emitter follower with the collectors thereof connected by way of respective resistors to the positive side of a supply battery 112. Similarly, the collectors of transistors 100 and 102 are connected by way of respective resistors to the positive side of battery 112.

As previously described at time $t_1$, the positive potential of battery 86 is applied to the base of transistor 100 thereby tending to turn on that transistor. With transistor 100 being turned on, a signal is applied by way of the second cross connection to turn off transistor 102, which produces a signal applied by way of the first cross connection tending to further turn on transistor 100. Accordingly, flip-flop 62 is switched from its second to its first stable state. At time $t_2$, the negative potential of battery 90 is applied to transistor 100 thereby tending to turn that transistor 100 off. With transistor 100 being turned off, flip-flop 62 is switched back from its first to its second stable state.

The second cross connection of flip-flop 62 is connected to flip-flop output 65 which is applied as the input to level changer 54. It will be understood that output 65 provides output pulses having the same polarity direction as ramps 53. Specifically, between times $t_0$–$t_1$, output 65 provides a positive potential pulse with respect to ground and ramp 53*a* is of positive slope. Between times $t_1$–$t_2$, output 65 provides a negative going pulse or ground potential and ramp 53*b* is of negative slope. These signals varying between ground potential and a positive potential with respect to ground are inverted by level changer 54 into waveforms varying with respect to ground between a positive and a negative potential of equal magnitude.

Specifically, flip-flop output 65 is connected by way of a parallel combination of an input resistor 120 and a capacitor 120*a* to the base of a normally conductive PNP switching transistor 122. In addition, flip-flop output 65 is also connected by way of a parallel combination of an input resistor 124 and a capacitor 124*a* to the base of a normally nonconductive NPN switching transistor 125. Transistor 125 is maintained normally off by a battery 126 having its negative side connected by way of a resistor 127 to the base of transistor 125.

In operation of level changer circuit 54 for example, between times $t_0$–$t_1$, the positive going positive potential signal applied by way of output 65 is of sufficient value to turn off transistor 122 and turn on transistor 125. Accordingly, with transistor 125 on, the negative side of a battery 130 may be traced by way of the emitter, base and collector of conductive transistor 125 through a collector resistor 131 to output 54*a* connected to modulator 20. Between times $t_1$–$t_2$, the negative going signal on output 65 is of ground potential which reinforces the normally off and normally on states of transistors 122 and 125. Accordingly, the positive side of a battery 133 may be traced by way of the emitter, base and collector of conductive transistor 122 and by way of a collector resistor 135 to output 54*a*. Thus, it will now be understood that a positive going input signal to changer circuit 54 produces a negative potential output signal and a positive going input signal to circuit 54 produces a positive potential output signal with the negative and positive output of changer circuit being with respect to ground potential. Accordingly, the input waveform to changer circuit 54 varies between a positive potential and ground with that waveform being inverted to form a corresponding waveform at output 54*a* which varies between a positive potential of battery 133 and a negative potential of battery 130 with respect to ground.

The output pulses on conductor 54*a* are applied to modulator 20 and are conducted by way of (1) an inverter 140 to the cathode of a first diode 142 and (2) a conductor 143 to a cathode of a second diode 144. Diodes 142 and 144 control the conductive states of field effect transistors 145 and 146 respectively. Voltage ramp 31 is applied by way of conductor 51 to the source terminal of transistor 145 while ramp 30 is applied by way of conductor 50 to the source terminal of transistor 146. In operation of modulator 20, between times $t_0$–$t_1$, changer circuit 54 provides a negative potential signal by way of a resistor 148 to the base of NPN switching transistor 150 of inverter 140. This negative signal reinforces a turn off bias on transistor 150 which is maintained normally turned off by way of a battery 152 having its negative side connected by way of a resistor 153 to the base of transistor 150. Accordingly, with transistor 150 turned off, the positive side of a battery 155 may be traced by way of a resistor 156 to the collector of nonconductive transistor 150 and to the cathode of diode 142 thereby turning off that diode. Since diode 142 is turned off, transistor 145 is turned on as a result of its gate terminal being at substantially ground potential which may be traced by way of a resistor 157. With transistor 145 turned on, the negative potential of ramp 31 is substantially applied to integrator input 59 by way of the low resistance of the conductive field effect transistor 145. During this time, $t_0$–$t_1$, transistor 146 is turned off as a result of the negative potential on conductor 54*a* which is effective to turn on diode 144 thereby to apply a negative potential to the gate of transistor 146.

Thus, in accordance with the invention, voltage ramp 31 is applied to the input of integrator 55 until time $t_1$ when flip-flop 62 changes stable state and the signal on input 54*a* changes state. At time $t_1$, a positive going positive potential is applied to the base of transistor 150 which is effective to turn on that transistor. With transistor 150 turned on, the negative potential of a battery 160 may be traced by way of the emitter, base and collector of conductive transistor 150 to the cathode of diode 142 thereby turning on that diode. Thus, with both diode 142 and transistor 150 being turned on, the negative potential of battery 160 is applied to the gate of transistor 145 which is effective to turn off that transistor. In addition, the positive potential input applied by way of conductor 54*a* is also effective to turn off diode 144 so that ground potential is applied by way of a resistor 162 to the gate of transistor 146, thereby turning on that transistor. With transistor 146 turned on between times $t_1$–$t_2$, the positive potential of ramp 30 is applied by way of input 50, the substantially small value resistance of conductive transistor 146, to the input of integrator 55.

The foregoing explanation applies for each of the time periods subsequent to time $t_2$ to provide that the output of modulator 20 assumes substantially the potential of ramp 31 upon application of input negative going pulses on conductor 54*a* and assumes substantially the potential of ramp 30 upon application of input positive going pulses. Each pulse has identical time duration as the corresponding input pulse which is equal in time duration to the corresponding stable state time of flip-flop 62.

It will also be understood that the input pulses to integrator 55 are required to be in the opposite or inverted polarity direction at corresponding times as output ramps 53 of integrator 55. In order to accomplish this, output 65 is taken from flip-flop 62 having the same polarity direction as ramps 53 with the pulses on output 65 being inverted by changer circuit 54. These inverted pulses are modulated by modulator 20 and without further inversion, applied to integrator 55. In the foregoing loop, an odd number of inversions are required to take place and in this embodiment, one inversion has been provided.

As previously described, the outputs of flip-flop 62 are applied to buffer 70. Specifically, output 65, providing pulses having the same polarity direction as ramps 53, is connected by way of an input resistor 165, an input capacitor 166 to the anode of a diode 168. Similarly, flip-flop output 66, providing pulses having the inverse polarity direction as ramps 53, is connected by way of an input resistor 170, an input capacitor 171 to the anode of a diode 173. The cathodes of diodes 168 and 173 respectively are connected together and to base of an NPN switching transistor 175. Transistor 175 is maintained normally turned off by means of a negative supply battery 177 having its negative side connected by way of resistor 179 to the base of transistor 175.

At time $t_0$, a positive going wave front appears on conductor 65 which is effective to turn on diode 168 and to render conductive transistor 175. With transistor 175 turned on, the positive side of a supply battery 180 may be traced by way of a resistor 181 through conductive transistor 175 and output conductor 71 to the base of a PNP switching transistor 190 of one-shot 73. Capacitor 166 operates as a differentiating capacitor and rapidly charges thereby to turn off diode 168 so that the negative bias turns off transistor 175. In this manner, a positive going spike pulse is produced on output 71 at a time $t_0$ as illustrated in FIG. 2. On the other hand, the negative going pulse applied by way of conductor 66 at time $t_0$ turns off diode 173 and is conducted to ground by way of a grounding diode 183.

At time $t_1$, a positive going wave front at conductor 66 is effective by way of capacitor 171 to turn on diode 173 thereby to turn on transistor 175. Accordingly, a positive spike pulse is applied to transistor 190 during the charging time of capacitor 171. At time $t_1$, the negative going signal on conductor 65 is applied by way of capacitor and is grounded by way of diode 182. Thus, it will now be understood that a positive going spike is produced at output 71 for each positive going (positive potential) wave front appearing at either flip-flop outputs 65 and 66 which occurs as a result of flip-flop 62 being switched in stable state.

One-shot or monostable multivibrator 73 comprises a pair of switching transistors 190 and 192 of the PNP type in which in the stable state, transistor 190 is normally turned on and transistor 192 is normally turned off. Monostable multivibrators are well known in the art. Multivibrator 73 includes in a first of its cross connections, a coupling capacitor 193 having one side connected to the base of transistor 190 and the other side connected by way of the emitter and base of an emitter follower transistor 194 to the collector of 192. A second of the cross connections is from the base of transistor 192 through a parallel combination of a resistor 196 and a capacitor 196a and through the emitter and base of an emitter follower transistor 197 to the collector of transistor 190. The collectors of transistors 190, 192, 194 and 197 are connected by way of respective resistors to the negative side of a supply battery 198. Transistor 190 is maintained normally on by means of a battery 200 having its negative side connected by way of a resistor 201 to the base of that transistor. In addition, transistor 192 is maintained normally off by means of a battery 203 having a positive side connected by way of a resistor 204 to the base of that transistor.

In its stable state, with transistor 190 turned on, a charging circuit for coupling capacitor 193 may be traced by way of the negative side of battery 198, transistor 194, capacitor 193 and through the base emitter junction of conductive transistor 190 to ground. In its stable state, the coupling capacitor 193 achieves a steady state value with its right hand plate charged negative with respect to its left hand plate and negative with respect to ground. Thus, the oscillator output terminal 12 connected to the right hand plate of capacitor 193 provides a normal negative potential with respect to ground as a base line of output pulses 12a.

As previously described, at time $t_0$, a positive spike signal is applied to transistor 190 to turn off that transistor. As transistor 190 is turned off, the potential at its collector rises in a negative going direction from ground potential which is applied to the base of transistor 192 thereby turning on that transistor. With transistor 190 off and 192 on, multivibrator 73 has been switched from its stable to its quasi-stable state. Accordingly, a discharge circuit for coupling capacitor 193 may be traced from its right hand plate, emitter base junction of transistor 94 and then through conductive transistor 192, ground, battery 200, resistor 201, to the left hand plate of the capacitor. With the right hand negatively charged side of capacitor 193 being substantially at ground potential, it will be understood that its left hand plate is at a positive potential which is effective to maintain transistor 190 turned off. As capacitor 193 discharges, the potential at the left hand plate changes in a negative going direction toward the negative potential of battery 200 until, at time $t_0$, transistor 190 is turned on. With transistor 190 conductive, a signal is applied by way of the second cross connection to turn off transistor 192 and one-shot 73 has returned to its stable state. In this manner, one-shot 73 at output 12 generates rectangular shaped pulses 12a having a substantially short time duration determined by the value of coupling capacitor 193 which is selected so that pulses 12a have a substantially shorter time duration than the stable state of flip-flop 62 and the time duration of ramps 53.

As previously described, ramps 30 and 31 are initiated by actuating switches contacts 39a and 40a of sweep control system 25 to their upper position. When it is desired to terminate ramps 30 and 31 and thereby to terminate the sweep of pulse frequencies by oscillator 10, switch contacts 39a and 40a are actuated to their lower position to provide a grounded output at terminals 45 and 48. At that time, it will be understood that ramps 30 and 31 have their greatest absolute magnitude slope and thus, the pulse repetition frequency of oscillator 10 is at its highest value. Thus, in accordance with the invention, the repetition frequency or rate of oscillator 10 is swept from its lowest value at the initiation of ramps 30 and 31 and increases linearly until the termination of ramps 30 and 31.

As illustrated in FIG. 1, the initiation and termination of ramps 30 and 31 is accomplished by manual actuation of switches contacts 39a and 40a. These switches contacts may be automatically actuated to initiate the ramps and then to terminate the ramps at a predetermined limiting potential as illustrated in FIG. 4. The various elements of sweep control 25a are identical with those of sweep control 25, FIG. 1, and therefore have been identified by the same reference characters. In FIG. 4, movable switch contacts 40a and 39a are connected to the movable slug of a relay 220 connected to the "1" side of a flip-flop 222. Flip-flop 222 is normally in a set state so that relay 220 is energized to actuate contacts 40a and 39a to their lower position thereby to provide a grounded output integrator terminal 33c.

To initiate ramps 30 and 31, a switch 224 is momentarily closed to provide a closed circuit for the application of the negative potential of a battery 225 to the reset side of flip-flop 222 thereby to reset that flip-flop. With flip-flop 222 reset, relay 220 is deenergized and contacts 40a and 39a are spring biased to their upper position to apply an input potential to integrator 33 in the manner previously described.

The output 33c of integrator 33 is applied to a limiting switch 228 which may be adjusted to produce an output pulse when the input thereof reaches a predetermined negative potential. Accordingly, at time $t_{12}$ for example, limiting switch 228 may be adjusted to provide a negative going pulse thereby to set flip-flop 222 which energizes relay 220. Thus, switch contacts 40a and 39a are actuated to their lower position thereby grounding integrator 33 and terminating pulses 30 and 31.

Now that the principles of the invention have been explained, it will be understood that many more modifications may be made. For example, in FIGS. 1 and 4, battery 38 may be reversed so that a negative potential with respect to ground is applied to the input of integrator 33. Accordingly, a linear voltage ramp of negative slope will then be produced at terminal 45 and a positive slope ramp will be produced at output 48. Thus, modulator 20 will provide a reversed modulation in which the initial pulses will be modulated at maximum amplitude while the pulses at the termination of the ramps will be modulated at minimum amplitude. Thus, the pulse repetition frequency will have a maximum rate initially and a minimum rate at termination with a linear sweep therebetween.

Further, in FIG. 4, the pulse frequency may be swept from a minimum rate to a maximum rate and then back to a minimum rate. Specifically, contact 39*b* may be connected to a rate adjust negative potential instead of ground and switch 228 may be replaced by level detector such as detector 60. Switch 40 is maintained open. Thus, when a negative slope ramp at output 33*c* reaches a predetermined amplitude, relay 220 is energized to actuate contact 39*a* to its lower position and to apply a negative potential to integrator 33. When the resultant positive slope ramp reached a predetermined amplitude, relay 220 is deenergized and contact 39*a* engages contact 39*c*. The operation continues as above described.

In addition, sweep control system 25 may generate ramps 30 and 31 by means other than an integrator such as by a function generator as described in the above cited text by Korn and Korn p. 233 et seq. Thus, the varying signal produced by system 25 and applied to modulator 20 may be other than a straight line curve. In this manner, the pulse frequency of oscillator 10 would vary at a rate corresponding to the function of the varying signal.

What is claimed is:

1. In a transfer function generator for producing a swept composite sinusoidal waveform, a sweep oscillator providing a series of output pulses having a varying pulse repetition frequency comprising:

function generator means upon application of input signals to an input for providing at an output voltage ramps, bistable means connected to said output of said function generator means for switching the stable state thereof when a ramp reaches a predetermined magnitude potential, pulse generator means connected to said bistable means for generating at an oscillator output an output pulse each time said bistable means changes stable state, sweep control means for providing at least one varying signal in accordance with a predetermined function, modulator means connected between said bistable means and said input of said function generator means and coupled to said pulse generator means for providing pulses substantially equal in time duration to the stable states of said bistable means with said pulses being equal in amplitude to said varying signal thereby to vary the pulse repetition frequency of said output pulses in accordance with said predetermined function, and means connected to said oscillator output for producing separate signals of rectangular and triangular waveform and for summing said waveforms to provide said swept composite sinusoidal waveform.

2. A transfer function analyzer having a function generator for producing a composite sinusoidal sweep frequency stimulating signal for a system under test and a correlator having the output of said system under test applied thereto for providing a measurement of the transfer function and a master sweep oscillator for providing a series of output pulses to control said transfer function generator and said correlator comprising:

function generator means for providing voltage ramps, bistable means connected to an output of said function generator means whereby said bistable means switches stable state when a ramp reaches a predetermined value of potential, pulse generator means connected to said bistable means for generating one of said output pulses each time said bistable means changes in stable state, sweep control means for providing at least one varying signal in accordance with a predetermined function, and modulator means connected between said bistable means and said function generator means and coupled to said sweep control means for providing pulses substantially equal in time duration to the stable states of said bistable means with said pulses being equal in amplitude to said varying signals thereby to vary the pulse repetition frequency of said output pulses in accordance with said predetermined function and thereby to provide a sweep frequency stimulating sinusoidal signal.

3. In a transfer function generator for producing a swept digital sinusoidal waveform:

an oscillator providing a series of output pulses in which the pulse repetition frequency is swept through a band of frequencies comprising, intergrator means upon application of input signals for providing at an output substantially linear first voltage ramps of positive slope and of negative slope, bistable means connected to said output of said integrator means for switching the stable state thereof when a positive slope first ramp reaches a predetermined value of positive potential and when a negative slope first ramp reaches a predetermined value of negative potential, pulse generator means connected to said bistable means for generating an output pulse each time said bistable means changes stable state for producing said series of output pulses, sweep control means for providing second voltage ramps one of positive slope and one of negative slope with each slope being substantially smaller in magnitude than said first ramps, modulator means connected between an output of said bistable means and an input of said integrator means and coupled to said pulse generator means for providing pulses substantially equal in time duration to each of the stable states of said bistable means with each of said pulses being modulated in amplitude by said second ramps thereby in sequence to increase the absolute magnitude slopes of said first ramps and to switch the stable state of said bistable means at an increasingly faster linear rate thereby to increase the pulse repetition frequency of said series of output pulses at a linear rate, and means connected to said pulse generator means for producing separate signals of rectangular waveform and separate signals of right-angled triangular waveform and for summing said waveforms to provide said swept digital sinusoidal waveform.

4. The oscillator of claim 3 in which said sweep control means includes means for varying the slope of each of said voltage ramps with each ramp having slopes of equal absolute magnitude.

5. The oscillator of claim 3 in which said modulator means comprises a first and a second switching circuit for controlling the application of said positive slope second ramp and said negative slope second ramp respectively to an input of said integrator means.

6. The oscillator of claim 3 in which said bistable means includes a first bistable output providing first pulses having the same polarity direction as said first ramps and a second bistable output providing second pulses having the inverted polarity direction as said first ramps and, inverting means connected to said first bistable output for inverting said first pulses to provide positive going and negative going pulses to said modulator means.

7. The oscillator of claim 6 in which said modulator means comprises a first switching circuit for applying said positive slope second ramp to an input of said integrator means upon actuation of said first switching circuit and a second switching circuit for applying said negative slope second ramp to said input of said integrator means upon actuation of said second switching circuit, and controlling means connected to said first and second switching circuit and to said inverting means for alternately actuating to a circuit closing position said first and second switching means (1) upon application of said positive going pulse for closing said first circuit and opening said second circuit and (2) upon application of said negative going pulse for closing said second circuit and opening said first circuit.

8. The oscillator of claim 7 in which said sweep control means comprises additional integrator means having a substantially longer time constant than said integrator means, and adjustable voltage means for applying a predetermined magnitude potential to an input of said additional integrator means.

9. The oscillator of claim 8 in which said sweep control means includes a first and a second inverting amplifier, means connecting the output of said additional integrator means to an input of said first inverting amplifier and connecting an output of said first inverting amplifier to an input of said second inverting amplifier, and means connecting said output of said first inverting amplifier to said first switching means and an output of said second inverting amplifier to said second switching means.

10. In a transfer function analyzer, a function generator providing a swept composite sinusoidal waveform including an oscillator providing a series of output pulses in which the pulse repetition frequency increases at a linear rate thereby to sweep a band of pulse frequencies comprising:

integrator means for providing at an output a substantially linear first voltage ramp of positive slope upon application of a negative going input signal and a substantially linear first voltage ramp of negative slope upon application of a positive going input signal, bistable means connected to said output of said integrator means for switching the stable state thereof (1) when a positive slope first ramp reaches a predetermined value of positive potential and (2) when a negative slope first ramp reaches a predetermined value of negative potential, said bistable means including a first bistable output providing first pulses having the same polarity direction as said voltage ramps and a second bistable output providing second pulses having the inverted polarity direction as said voltage ramps, inverting means connected to said first bistable output for inverting said first pulses to provide positive and negative going pulses, pulse generator means connected to said first and second bistable outputs for generating an output pulse each time the stable state of said bistable means switches with each output pulse being of rectangular wave shape of substantially shorter time duration than said first ramps, thereby to provide said series of output pulses, sweep control means providing substantially linear second voltage ramps, one of positive slope and one of negative slope, with each slope (1) having substantially the same absolute magnitude and (2) being substantially smaller in magnitude than said first ramps, modulator means connected to said inverting means and said sweep control means for providing (1) a modulated positive going pulse during each time duration of an applied inverted positive going pulse having the linearly varying amplitude of said positive slope second ramp, and (2) a modulated negative going pulse during the time duration of an applied inverted negative going pulse having the linearly varying amplitude of said negative slope second ramp, means connecting an output of said modulator means to said integrator means for applying said modulated pulses each in turn increasing in absolute value whereby the slopes of the corresponding first ramps in turn increase in absolute magnitude to vary the repetition frequency of said output pulses at a linear rate, and means connected to said pulse generator means for producing separate signals of rectangular waveform and separate signals of right angled triangular waveform and for summing said waveforms to produce said swept composite sinusoidal waveform.

11. The oscillator of claim 10 in which said modulator means comprises a first switching circuit upon actuation for applying said positive slope second ramp to said integrator means and a second switching circuit upon actuation for applying said negative slope second ramp to said integrator means and controlling means connected to said switching circuits and to said inverting means for alternately actuating said switching circuits upon changing of direction of said positive and negative going pulses.

12. The oscillator of claim 11 in which said first switching circuit comprises a first field effect transistor and said second switching circuit comprises a second field effect transistor with an output terminal of each of said transistors being connected to an input of said integrator means, a second diode connected between said inverting means and a gate terminal of said second transistor and a first diode connected between said inverting means and a gate terminal of said first transistor, and an additional inverting means connected between said inverting means and said second diode.

References Cited

UNITED STATES PATENTS

| | | | |
|---|---|---|---|
| 2,922,118 | 1/1960 | Albright | 331—178 X |
| 3,274,511 | 9/1966 | Dale et al. | 331—178 X |
| 3,364,437 | 1/1968 | Loposer et al. | 331—178 X |

JOHN S. HEYMAN, *Primary Examiner.*

307—228, 271; 331—47, 111